United States Patent
Azakami et al.

(10) Patent No.: US 12,518,891 B2
(45) Date of Patent: Jan. 6, 2026

(54) OVERCOAT AGENT FOR ELECTROCONDUCTIVE COATING, INSULATING OVERCOAT FOR ELECTROCONDUCTIVE COATING, AND COATING STRUCTURE

(71) Applicant: Fujikura Kasei Co., Ltd., Tokyo (JP)

(72) Inventors: Yuka Azakami, Kuki (JP); Katsutomo Wakabayashi, Kuki (JP)

(73) Assignee: Fujikura Kasei Co., Ltd., Tokyo (JP)

(*) Notice: Subject to any disclaimer, the term of this patent is extended or adjusted under 35 U.S.C. 154(b) by 185 days.

(21) Appl. No.: 18/259,168

(22) PCT Filed: Jan. 20, 2022

(86) PCT No.: PCT/JP2022/002058
§ 371 (c)(1),
(2) Date: Jun. 23, 2023

(87) PCT Pub. No.: WO2022/172722
PCT Pub. Date: Aug. 18, 2022

(65) Prior Publication Data
US 2024/0304357 A1 Sep. 12, 2024

(30) Foreign Application Priority Data
Feb. 10, 2021 (JP) .................. 2021-020154

(51) Int. Cl.
*H01B 3/44* (2006.01)
(52) U.S. Cl.
CPC .................. *H01B 3/447* (2013.01)

(58) Field of Classification Search
CPC .................. H01B 3/44; H01B 3/447
See application file for complete search history.

(56) References Cited

U.S. PATENT DOCUMENTS

| | | | |
|---|---|---|---|
| 6,426,143 B1* | 7/2002 | Voss | H05K 3/182 |
| | | | 174/254 |
| 9,783,670 B2* | 10/2017 | Nomura | C08L 63/00 |
| 10,611,935 B2 | 4/2020 | Mogami | |
| 2022/0185935 A1* | 6/2022 | Ueno | C08J 5/18 |

(Continued)

FOREIGN PATENT DOCUMENTS

| | | |
|---|---|---|
| JP | H09500837 A | 1/1997 |
| JP | 2001214091 A | 8/2001 |

(Continued)

OTHER PUBLICATIONS

Japanese Patent Office, Office Action issued in JP 2022-581290 dated Oct. 8, 2024.

(Continued)

*Primary Examiner* — Chau N Nguyen
(74) *Attorney, Agent, or Firm* — Wood Herron & Evans LLP

(57) ABSTRACT

An overcoat agent for a conductive coating film according to one aspect of the present invention is an overcoat agent to be applied onto a conductive coating film to form an insulating overcoat, the overcoat agent including a (meth)acrylic copolymer having a triblock structure composed of a first polymer block and two second polymer blocks that are different from the first polymer block and are respectively located on both end sides of the first polymer block.

13 Claims, 1 Drawing Sheet

(56) References Cited

U.S. PATENT DOCUMENTS

| | | | | |
|---|---|---|---|---|
| 2022/0372271 A1* | 11/2022 | Hirabayashi | ............ | C09K 3/10 |
| 2023/0242690 A1* | 8/2023 | Homma | ............ | G02B 6/02395 |
| | | | | 525/226 |

FOREIGN PATENT DOCUMENTS

| | | | |
|---|---|---|---|
| JP | 2009079119 A | 4/2009 |
| JP | 2014090150 A | 5/2014 |
| JP | 2018148005 A | 9/2018 |

OTHER PUBLICATIONS

European Patent Office, Search Report issued in EP 22752553.2 dated Dec. 12, 2024.
PCT Office, International Search Report issued in PCT/JP2022/002058 dated Apr. 19, 2022.

\* cited by examiner

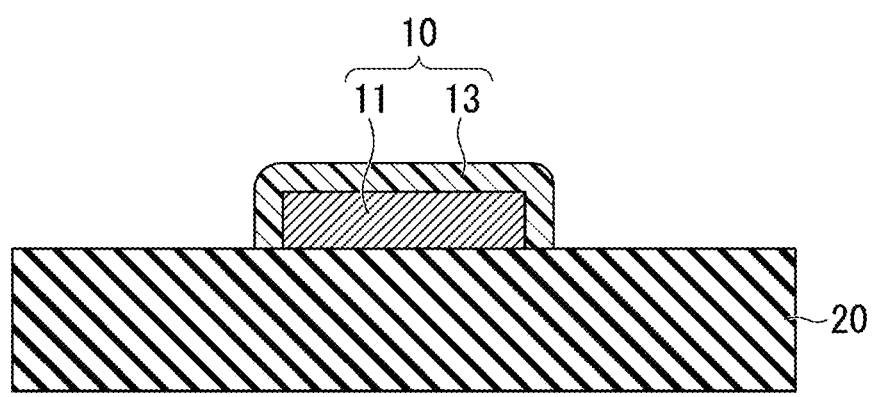

OVERCOAT AGENT FOR ELECTROCONDUCTIVE COATING, INSULATING OVERCOAT FOR ELECTROCONDUCTIVE COATING, AND COATING STRUCTURE

TECHNICAL FIELD

The present invention relates to an overcoat agent for a conductive coating film, an overcoat for a conductive coating film, and a coating film structure.

Priority is claimed on Japanese Patent Application No. 2021-020154, filed Feb. 10, 2021, the content of which is incorporated herein by reference.

BACKGROUND ART

A circuit on a printed circuit board is formed, for example, by applying a conductive paste containing conductive particles and a binder resin onto a substrate.

In a printed circuit board, in order to protect the circuit and prevent short circuits, an overcoat agent may be applied on top of a conductive coating film formed with a conductive paste to form an insulating overcoat.

Patent Document 1 describes formation of an insulating coating film by applying a coating material containing a thermoplastic resin such as epoxy acrylates or unsaturated polyesters on top of a conductive coating film.

CITATION LIST

Patent Document

[Patent Document 1] Japanese Unexamined Patent Application, First Publication No. 2001-214091

SUMMARY OF INVENTION

Technical Problem

However, when a conventional overcoat agent is applied to a conductive coating film, phenomena such as an increase in the resistance value of the conductive coating film and deformation of the conductive coating film may be observed. When the printed circuit board is subjected to a molding process in a state where such a phenomenon has occurred, a phenomenon of further increase in the resistance value of the conductive coating film may be observed, as compared to the case where the printed circuit board is subjected to a molding process in a state where no overcoat is formed.

An object of the present invention is to provide an overcoat agent for a conductive coating film, an insulating overcoat for a conductive coating film, and a coating film structure with which the resistance value of the conductive coating film is less likely to increase.

Solution to Problem

The present invention includes the following aspects.

[1] An overcoat agent for a conductive coating film which is an overcoat agent to be applied onto a conductive coating film to form an insulating overcoat,
the overcoat agent containing a (meth)acrylic copolymer having a triblock structure composed of a first polymer block and two second polymer blocks that are different from the first polymer block and are respectively located on both end sides of the first polymer block.

[2] The overcoat agent for a conductive coating film according to the above [1], wherein a ratio represented by a formula: (total mass of the two second polymer blocks)/(mass of the first polymer block) is within a range of 10/90 to 60/40.

[3] The overcoat agent for a conductive coating film according to the above [1] or [2], wherein the first polymer block has a glass transition temperature of −75 to −35° C.

[4] The overcoat agent for a conductive coating film according to any one of the above [1] to [3], wherein each of the two second polymer blocks has a glass transition temperature of 75° C. or higher.

[5] An insulating overcoat for a conductive coating film, which is a coating film of the overcoat agent for a conductive coating film according to any one of the above [1] to [4].

[6] A coating film structure including a conductive coating film and the insulating overcoat for a conductive coating film according to the above [5] provided on the conductive coating film.

Advantageous Effects of Invention

According to the present invention, it is possible to provide an overcoat agent for a conductive coating film, an insulating overcoat for a conductive coating film, and a coating film structure with which the resistance value of the conductive coating film is less likely to increase.

BRIEF DESCRIPTION OF DRAWINGS

FIG. 1 is a schematic cross-sectional view showing an example of a coating film structure.

DESCRIPTION OF EMBODIMENTS

In the present invention, the term "conductivity" means that the specific resistance is less than $1.0 \times 10$ Ω·cm.

The term "insulating" means that the specific resistance is $1.0 \times 10^4$ Ω·cm or more.

The term "(meth)acrylic" is a generic term that includes both "acrylic" and "methacrylic". The same also applies to "(meth)acrylic acid ester", "(meth)acrylic acid", and "(meth)acrylonitrile".

In the present specification, reversible addition-fragmentation chain transfer polymerization is referred to as "RAFT polymerization", and a chain transfer agent used in RAFT polymerization is referred to as a "RAFT agent".

In the present specification, the number average molecular weight is also referred to as "Mn", and the weight average molecular weight is also referred to as "Mw". Each of Mn and Mw is a standard polystyrene-equivalent value measured by a gel permeation chromatography (GPC) method.

An "acid value" of a copolymer is the number of mg of potassium hydroxide required for neutralizing the acid contained in 1 g of the copolymer, and is measured in accordance with JIS K 2501:2003.

In the present specification, the glass transition temperature is also referred to as "Tg".

The Tg of a polymer block is obtained from the Fox equation shown in the following formula (i). The Tg of a copolymer is also obtained in the same manner.

$$1/(Tg_P + 273.15) = \sum [W_i/(Tg_i + 273.15)] \qquad (i)$$

In the formula (i), $Tg_P$ is Tg (° C.) of a polymer block, $W_m$ is the mass fraction of a monomer constituting the polymer block (hereinafter also referred to as "monomer m"), and $Tg_m$ is Tg (° C.) of a homopolymer of the monomer m.

It should be noted that $Tg_m$ is widely known as a characteristic value of homopolymers, and for example, the value described in "POLYMER HANDBOOK, THIRD EDITION" or the catalog value supplied by the manufacturer may be used.

[Overcoat Agent for Conductive Coating Film]

An overcoat agent for a conductive coating film according to one aspect of the present invention (hereinafter also simply referred to as "overcoat agent") contains a specific copolymer (hereinafter also referred to as "copolymer A").

From the viewpoint of coatability, the overcoat agent preferably contains an organic solvent.

The overcoat agent may contain a cross-linking agent, if necessary.

If necessary, the overcoat agent may contain components other than those described above within a range that does not depart from the scope of the present invention.

<Copolymer A>

The copolymer A is a (meth)acrylic copolymer having a triblock structure composed of a first polymer block (hereinafter also referred to as "block (1)") and two second polymer blocks (hereinafter referred to as "block (2)" located on both end sides of the block (1). The copolymer A can also be represented as block (2)-b-block (1)-b-block (2). Each block will be described in detail later.

The term "(meth)acrylic copolymer" means a copolymer in which at least a portion of the monomer units constituting the copolymer are (meth)acrylic monomer units. The term "(meth)acrylic monomer" means a compound having a (meth)acryloyl group. Examples of the (meth)acrylic monomer include (meth)acrylic acid esters, (meth)acrylic acids, (meth)acrylamide compounds and (meth)acrylonitriles. At least a portion of the (meth)acrylic monomer units are preferably (meth)acrylic acid ester units.

A ratio of the (meth)acrylic monomer units with respect to all the monomer units constituting the copolymer A is preferably 80% by mass or more, and more preferably 95% by mass or more.

A ratio represented by a formula: (total mass of two blocks (2))/(mass of block (1)) is preferably within the range of 10/90 to 60/40. If this ratio is equal to or more than the above lower limit value, tackiness tends not to remain on the surface of the coating film of the overcoat agent, and if this ratio is equal to or less than the above upper limit value, extension of the coating film of the overcoat agent is favorable, and there is tendency that cracks are less likely to occur during bending and elongation.

The copolymer A preferably has an acid value. The expression "has an acid value" means to have an acid group. Examples of the acid group include a carboxy group and the like.

When the copolymer A has an acid value, the acid value is preferably from 5 to 35 mgKOH/g. If the copolymer A has an acid value, it can be crosslinked with an isocyanate or the like. In particular, when the acid value is equal to or more than the above lower limit value, a sufficient crosslinked structure is formed in the coating film of the overcoat agent, and the strength of the coating film tends to be excellent. When the acid value is equal to or less than the above upper limit value, the storage stability of the overcoat agent tends to be excellent.

The Mw of the copolymer A is preferably from 20,000 to 80,000, and more preferably from 20,000 to 50,000. If the Mw is equal to or more than the above lower limit value, the coating film strength tends to be excellent, and if the Mw is equal to or less than the above upper limit value, the coating workability tends to be excellent.

The molecular weight dispersity (Mw/Mn) of the copolymer A is preferably 2.0 or less, and more preferably from 1.2 to 2.0. When the molecular weight dispersity is equal to or less than the above upper limit value, the coating workability tends to be excellent.

(Block (1))

The block (1) is located in the central part of the triblock structure.

The block (1) preferably contains at least one selected from the group consisting of (meth)acrylic monomer units and aromatic vinyl compound units. Examples of the (meth) acrylic monomer include (meth)acrylic acid esters, (meth) acrylic acids, (meth)acrylamides and (meth)acrylonitriles.

Examples of the aromatic vinyl compound include styrene, α-methylstyrene, o-, m- or p-methylstyrene and o-, m- or p-chlorostyrene. Among these, styrene is preferred.

The block (1) may further contain other monomer units as necessary.

The block (1) preferably contains at least one selected from the group consisting of a (meth)acrylic acid ester (hereinafter also referred to as "monomer (1)") unit having a linear or branched side chain and an aromatic vinyl compound unit. When the block (1) contains the monomer (1) unit or the aromatic vinyl compound unit, the copolymer A tends to have a microphase-separated structure in the coating film of the overcoat agent.

Examples of side chains of the monomer (1) include alkyl groups and alkoxyalkyl groups.

The number of carbon atoms in the side chain is preferably from 1 to 8, more preferably from 2 to 8, and still more preferably from 4 to 8. When the number of carbon atoms in the side chain is 1 or more, the copolymer A tends to have a microphase-separated structure in the coating film of the overcoat agent, and when the number of carbon atoms is 8 or less, tackiness tends to be less likely to remain.

The side chain is preferably linear from the viewpoint of flexibility, and is preferably branched from the viewpoint of coatability.

Specific examples of the monomer (1) include alkyl (meth)acrylates such as methyl (meth)acrylate, ethyl (meth) acrylate, n-butyl (meth)acrylate, isobutyl (meth)acrylate, and 2-ethylhexyl (meth)acrylate; and alkoxyalkyl (meth) acrylates such as 2-methoxyethyl (meth)acrylate, 2-ethoxyethyl (meth)acrylate, 2-(n-propoxy)ethyl (meth)acrylate, 2-(n-butoxy)ethyl (meth)acrylate, 3-methoxypropyl (meth) acrylate, 3-ethoxypropyl (meth)acrylate, 2-(n-propoxy)propyl acrylate, and 2-(n-butoxy)propyl (meth)acrylate). Any one of these monomers may be used alone, or two or more types thereof may be used in combination. For example, a monomer having a side chain with 1 to 3 carbon atoms and a monomer having a side chain with 4 to 8 carbon atoms may be used in combination. A monomer having a linear side chain and a monomer having a branched side chain may be used in combination.

The block (1) may further contain a monomer unit other than the monomer (1) and the aromatic vinyl compound, if necessary.

Examples of the monomer other than the monomer (1) and the aromatic vinyl compounds include cyclic structure-containing monomers other than the aromatic vinyl compounds and functional group-containing monomers. The cyclic structure-containing monomers and functional group-containing monomers will be described later in detail. Any one of these monomers may be used alone, or two or more types thereof may be used in combination.

A ratio of the total of monomer (1) units and aromatic vinyl compound units with respect to the total (100% by mass) of all monomer units constituting the block (1) is preferably 70% by mass or more, more preferably 85% by mass or more, and may be 100% by mass.

The Tg of the block (1) is preferably from −75 to −30° C., and more preferably from −70 to −40° C. If the Tg of the block (1) is equal to or less than the above upper limit value, cracks are less likely to occur when the coating film of the overcoat agent is bent or stretched, and if the Tg is equal to or more than the above lower limit value, tackiness is less likely to remain on the surface of the coating film of the overcoat agent.

The Tg of the block (1) can be adjusted by the type and mass fraction of the monomer forming the block (1).

(Block (2))

Two blocks (2) are located at both end portions of the triblock structure.

Each of the two blocks (2) is different from the block (1). The expression "the block (2) is different from the block (1)" means that the composition of the monomer units constituting the block (2) (either one or both of the type and ratio of the monomer units) is different from the composition of the monomer units constituting the block (1). It is preferable that at least a portion of the monomer units constituting the block (2) is different from the monomer units constituting the block (1).

The two blocks (2) may be the same as or different from each other. Preferred embodiments of one block (2) will be described below, and the same applies to preferred embodiments of the other block (2).

The block (2) preferably contains a (meth)acrylic monomer unit. Examples of the (meth)acrylic monomer include the same as those mentioned above.

The block (2) may further contain a monomer unit other than the (meth)acrylic monomer, if necessary.

The block (2) preferably contains a cyclic structure-containing monomer unit. When the block (2) contains a cyclic structure-containing monomer unit, the copolymer A tends to have a microphase-separated structure in the coating film of the overcoat agent, and when the overcoat agent is applied onto a conductive coating film, the effect of suppressing an increase in the resistance value of the conductive coating film can be easily obtained.

Examples of the cyclic structure-containing monomers include cyclic structure-containing (meth)acrylic acid esters and aromatic vinyl compounds.

Examples of the cyclic structure-containing (meth)acrylic acid esters include (meth)acrylic acid esters having an aromatic ring structure such as benzyl (meth)acrylate and 2-phenoxyethyl (meth)acrylate; and (meth)acrylic acid esters having an alicyclic structure such as cyclohexyl (meth)acrylate, dicyclopentanyl (meth)acrylate and isobornyl (meth)acrylate.

Examples of the aromatic vinyl compound include the same as those described above.

Any one of these monomers may be used alone, or two or more types thereof may be used in combination.

As the cyclic structure-containing monomer, an aromatic vinyl compound is preferred, and styrene is particularly preferred from the viewpoint that a microphase-separated structure can be easily formed.

The block (2) preferably contains a functional group-containing monomer unit such as a carboxy group-containing monomer, a hydroxy group-containing monomer, and a glycidyl group-containing monomer.

When the block (2) contains a functional group-containing monomer unit, the heat resistance can be improved by using a crosslinking agent having an isocyanate group, an epoxy group, a carboxy group or a hydroxy group used to impart a crosslinked structure.

When the block (2) contains a carboxy group-containing monomer unit as a functional group-containing monomer unit, the hydrogen bond between the carboxy groups causes a pseudo-crosslinked structure in the sequence of the copolymer A, and the coating workability can also be improved.

Examples of the carboxy group-containing monomer include (meth)acrylic acid, β-carboxyethyl (meth)acrylate, carboxypentyl (meth)acrylate, itaconic acid, crotonic acid, maleic acid and fumaric acid. Any one of these monomers may be used alone, or two or more types thereof may be used in combination.

Examples of the hydroxy group-containing monomer include 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate and (4-hydroxymethylcyclohexyl)methyl acrylate.

Any one of these monomers may be used alone, or two or more types thereof may be used in combination.

The block (2) may further contain a monomer unit other than the cyclic structure-containing monomer and the functional group-containing monomer, if necessary.

Examples of the monomer other than the cyclic structure-containing monomer and the functional group-containing monomer include the monomer (1) described above.

When the block (2) contains a cyclic structure-containing monomer unit, a ratio of the cyclic structure-containing monomer unit with respect to the total (100% by mass) of all monomer units constituting the block (2) is preferably 50% by mass or more, more preferably 80% by mass or more, and may be 100% by mass from the viewpoint of facilitating the occurrence of microphase separation. When the ratio of the cyclic structure-containing monomer unit is 50% by mass or more, the block (2) is highly hydrophobic, and the copolymer A tends to have a microphase-separated structure.

When the block (2) contains a cyclic structure-containing monomer unit and a monomer unit other than the cyclic structure-containing monomer unit, a ratio of the cyclic structure-containing monomer unit with respect to the total (100% by mass) of all monomer units constituting the block (2) is preferably 99% by mass or less.

When the block (2) contains a functional group-containing monomer unit, a ratio of the functional group-containing monomer unit with respect to the total (100% by mass) of all monomer units constituting the block (2) is preferably from 0.5 to 10.0% by mass, more preferably from 0.5 to 5.0% by mass, and still more preferably from 1.0 to 5.0% by mass.

When the block (2) contains a functional group-containing monomer unit and at least a portion of the functional group-containing monomer unit is a carboxy group-containing monomer unit, a ratio of the carboxy group-containing monomer unit with respect to the total (100% by mass) of all monomer units constituting the block (2) is preferably from 0.5 to 10.0% by mass, more preferably from 0.5 to 3.0% by mass, and still more preferably from 1.0 to 3.0% by mass. When the ratio of the carboxyl group-containing monomer units is equal to or more than the above lower limit value, the copolymer A is likely to have a pseudo-crosslinked structure, and when the ratio is equal to or less than the above upper limit value, the acid value of the copolymer A tends to be equal to or less than the preferred upper limit value described above.

The Tg of the block (2) is preferably 75° C. or higher, and more preferably 80° C. or higher. If the Tg of the block (2) is equal to or more than the above lower limit value, tackiness is less likely to remain on the surface of the coating film of the overcoat agent.

The upper limit of Tg of the block (2) is not particularly limited, but is, for example, 105° C.

The Tg of the block (2) can be adjusted by the type and mass fraction of the monomer forming the block (2).

Examples of preferred embodiments of the copolymer A include the following.

Copolymer A-1: a copolymer in which the block (1) contains an acrylic acid alkyl ester unit having an alkyl group of 2 to 8 carbon atoms, and each of the two blocks (2) contains a methyl methacrylate unit.

Copolymer A-2: a copolymer in which the block (1) contains an acrylic acid alkyl ester unit having an alkyl group of 4 to 8 carbon atoms, and each of the two blocks (2) contains an aromatic vinyl compound unit.

Copolymer A-3: a copolymer in which the block (1) contains an acrylic acid alkyl ester unit having an alkyl group of 2 to 8 carbon atoms, and each of the two blocks (2) contains a cyclic structure-containing (meth)acrylic acid ester unit.

In the block (1) of the copolymers A-1 to A-3, at least a portion of the acrylic acid alkyl ester units having an alkyl group of 2 to 8 carbon atoms is preferably an acrylic acid alkyl ester unit having an alkyl group of 4 to 8 carbon atoms.

The block (1) of the copolymers A-1 to A-3 may further contain a monomer unit other than the acrylic acid alkyl ester units having alkyl groups of 2 to 8 carbon atoms.

The block (2) of the copolymer A-1 may further contain a monomer unit other than the methyl methacrylate units. As the monomer unit other than the methyl methacrylate units, the monomer (1) units other than the methyl methacrylate units and functional group-containing monomer units are preferred.

The block (2) of the copolymer A-2 may further contain a monomer unit other than the aromatic vinyl compound unit. As the monomer unit other than the aromatic vinyl compound unit, a functional group-containing monomer unit is preferred.

The block (2) of the copolymer A-3 may further contain a monomer unit other than the cyclic structure-containing (meth)acrylic acid ester unit. As the monomer unit other than the cyclic structure-containing (meth)acrylic acid ester unit, a monomer (1) unit and a functional group-containing monomer unit are preferred.

(Method for Producing Copolymer A)

The copolymer A can be obtained, for example, by living polymerization.

Examples of living polymerization include living anionic polymerization and RAFT polymerization, and RAFT polymerization is preferred.

A RAFT agent and a polymerization initiator are used in RAFT polymerization.

Examples of the RAFT agent include sulfur-based compounds such as dithioesters, dithiocarbamates, trithiocarbonates, and xanthates. Specific examples include those described in Japanese Unexamined Patent Application, First Publication No. 2018-165300.

Examples of the polymerization initiator include azo-based polymerization initiators and peroxide-based polymerization initiators.

A method of RAFT polymerization is not particularly limited and known methods can be employed, and examples thereof include a solution polymerization method, an emulsion polymerization method, a bulk polymerization method and a suspension polymerization method.

The solvent used for RAFT polymerization is not particularly limited, and known solvents can be used.

For example, when using a RAFT agent having one reactive site such as a thiocarbonylthio group, first, in the presence of a polymerization initiator and a RAFT agent, a monomer mixture for forming the block (2) (hereinafter also referred to as a "monomer mixture (2)") is polymerized to obtain the block (2). Then, a monomer mixture for forming the block (1) (hereinafter also referred to as "monomer mixture (1)") is polymerized in the presence of the obtained block (2). As a result, a copolymer having a diblock structure composed of the block (2) and the block (1) is obtained. Then, the monomer mixture (2) is polymerized in the presence of the obtained copolymer having a diblock structure. As a result, the copolymer A having the intended triblock structure is obtained.

When using a RAFT agent having two reactive sites (for example, a compound represented by a formula (1) described later), first, in the presence of a polymerization initiator and a RAFT agent, the monomer mixture (2) is polymerized to obtain the block (2). Then, the monomer mixture (1) is polymerized in the presence of the obtained block (2). As a result, the copolymer A having the intended triblock structure is obtained.

More specifically, when the monomer mixture (2) is polymerized in the presence of a RAFT agent having two reactive sites, the blocks (2) are generated with a RAFT agent-derived structure sandwiched therebetween. When the monomer mixture (1) is then polymerized, the block (1) grows between the reactive site and the block (2). The central two blocks (1) are connected by a structure derived from a single molecule RAFT agent, and thus can be regarded as one polymer block.

<Organic Solvent>

The organic solvent is not particularly limited, and examples thereof include alcohol-based solvents such as 3-methoxy-3-methyl-1-butanol and 1-butanol; glycol-based solvents such as ethylene glycol monobutyl ether; ketone-based solvents such as isophorone and methyl ethyl ketone; and ester-based solvents such as ethyl acetate.

The organic solvent is preferably an organic solvent that does not dissolve the conductive coating film onto which the overcoat agent has been applied, more preferably an alcohol-based solvent or a glycol-based solvent, and still more preferably an alcohol-based solvent.

The content of the organic solvent can be appropriately set in consideration of the coatability of the overcoat agent, but is, for example, about 100 to 300 parts by mass with respect to 100 parts by mass of the copolymer A.

<Crosslinking Agent>

Examples of the crosslinking agent (curing agent) include isocyanate-based crosslinking agents such as hexamethylene diisocyanate (HDI), diphenylmethane diisocyanate (MDI), and isophorone diisocyanate (IPDI).

When the overcoat agent contains a crosslinking agent, the content of the crosslinking agent is, for example, about 5.0 to 10.0 parts by mass with respect to 100 parts by mass of the copolymer A.

<Other Components>

Examples of other components include additives such as surface conditioners.

The content of other components is, for example, about 0 to 10.0 parts by mass with respect to 100 parts by mass of the copolymer A.

The overcoat agent of the present embodiment can be produced by producing the copolymer A as described above and blending a liquid medium, a crosslinking agent, and other components as necessary.

The overcoat agent of the present embodiment is applied onto the conductive coating film to form an insulating overcoat. The conductive coating film and the insulating overcoat will be described in detail below.

According to the overcoat agent of the present embodiment, it is possible to suppress an increase in the resistance value of the conductive coating film when the overcoat agent is applied onto the conductive coating film.

The reason for the above effect is considered as follows.

It is considered that when a conventional overcoat agent is applied onto a conductive coating film, a portion of the resin component (epoxy acrylate, unsaturated polyesters, and the like) of the overcoat agent enters into the conductive coating film, thereby increasing the resistance value of the conductive coating film.

On the other hand, it is considered that since the copolymer A has the structure described above in the overcoat agent of the present embodiment, the copolymer A has a microphase-separated structure at the time of forming the coating film, and the solvent used is less likely to attack the conductive coating film. For this reason, it is considered that the copolymer A is less likely to enter into the conductive coating film, and the resistance value of the conductive coating film is less likely to increase.

In addition, the insulating overcoat formed from the overcoat agent of the present embodiment is also excellent in stretchability and moldability. The excellent moldability results in a favorable appearance of the overcoat to be formed.

[Insulating Overcoat for Conductive Coating Film]

An insulating overcoat for a conductive coating film according to one aspect of the present invention (hereinafter also simply referred to as an "overcoat") is a coating film of the overcoat agent described above and contains the copolymer A.

The copolymer A in the overcoat typically has a microphase-separated structure. The copolymer A may have a crosslinked structure.

The thickness of the overcoat is preferably from 10 to 40 μm, and more preferably from 20 to 30 μm. When the thickness of the overcoat is equal to or more than the above lower limit value, the conductive coating film tends to be excellent in insulation properties, and when the thickness is equal to or less than the above upper limit value, the overcoat tends to be excellent in film formability and elongation.

The thickness of the overcoat is the thickness of the upper surface side of the conductive coating film. Here, the thickness of the upper surface side of the conductive coating film refers to the thickness of a portion laminated on the upper surface of the conductive coating film (the surface opposite to the base material). For example, the thickness of an overcoat 13 shown in FIG. 1 is the thickness of a portion laminated on the upper side of a conductive coating film 11 in the drawing. The thickness of an overcoat is measured by a constant pressure thickness gauge.

An overcoat can be formed by applying the overcoat agent described above onto the conductive coating film, followed by heating as necessary.

Examples of the method for applying the overcoat agent include known coating methods such as a gravure printing method, an offset printing method, a screen printing method, a roll coating method, and a bar coating method.

Examples of heating conditions include conditions of 80 to 130° C. for 3 to 30 minutes.

[Coating Film Structure]

A coating film structure according to one aspect of the present invention includes a conductive coating film and the overcoat described above. The overcoat is provided on the conductive coating film.

FIG. 1 shows an example of a coating film structure. A coating film structure of this example includes a conductive coating film 11 provided on a base material 20 and an overcoat 13 provided on the conductive coating film 11. The conductive coating film 11 is provided on the base material 20. The overcoat 13 covers the entire surface of the conductive coating film 11.

The coating film structure of the present embodiment can be produced by forming an overcoat on the conductive coating film. The method of forming an overcoat is as described above.

<Conductive Coating Film>

The conductive coating film is not particularly limited, and may be a known conductive coating film.

As an example of a conductive coating film, one containing conductive particles and a binder resin can be mentioned. The conductive particles are dispersed in the binder resin.

Examples of the conductive particles include silver, nickel, copper, gold, platinum, carbon, and graphite.

The average particle size of the conductive particles is preferably 7 μm or less from the viewpoint of coatability when forming a conductive coating film. Although the lower limit of the average particle size is not particularly limited, it is, for example, 1 μm.

The average particle size of the conductive particles is the particle size at a cumulative volume percentage of 50% by volume in the volume particle size distribution. The volume particle size distribution is measured by a method in accordance with JIS Z 8825 "Particle size analysis-laser diffraction/scattering method".

Examples of the binder resin include polyester resins, phenoxy resins, polyamide resins, polyamideimide resins, polyimide resins, polyurethane resins, acrylic resins, polystyrenes, styrene-acrylic resins, styrene-butadiene copolymers, epoxy resins, phenol resins, polyether-based resins, polycarbonate-based resins, alkyd resins, polysulfone resins, polyethersulfone resins, vinyl chloride-vinyl acetate copolymer resins, ethylene-vinyl acetate copolymers, silicone resins and fluorine-based resins. Any one of these resins may be used alone, or two or more types thereof may be used in combination.

As the binder resin, a polyester resin or a polyurethane resin is preferred from the viewpoint of flexibility and hot workability. A polyester resin and a polyurethane resin may be used in combination.

A polyurethane resin is obtained by a reaction between a polyol resin and an isocyanate compound.

Examples of the polyol resin include polyester polyols, polyether polyols, polycarbonate polyols, and polycaprolactone polyols. Any one of these polyol resins may be used alone, two or more types thereof may be used in combination, or may be used in combination with a polyester resin.

A polyester polyol resin is preferred as the polyol resin, and the hydroxyl value thereof is, for example, from 2 to 100 mgKOH/g. The hydroxyl value of the polyester polyol resin is measured by a method in accordance with JIS K 0070 "Test methods for acid value, saponification value, ester value, iodine value, hydroxyl value and unsaponifiable matter of chemical products".

Examples of the isocyanate compound include hexamethylene diisocyanate (HDI), diphenylmethane diisocyanate (MDI), and isophorone diisocyanate (IPDI). A blocked isocyanate in which the isocyanate group of the above isocyanate compound is masked with a blocking agent may be used.

The conductive coating film may contain an additive as necessary. Examples of the additive include dispersants, surface conditioners, and thixotropic agents.

In the conductive coating film, the content of the conductive particles is, for example, from 40 to 95% by mass with respect to the total mass of the conductive coating film.

The content of the binder resin is, for example, from 5 to 60% by mass with respect to the total mass of the conductive coating film.

The thickness of the conductive coating film is, for example, from 5.0 to 20.0 μm.

The conductive coating film can be formed, for example, by applying a conductive paste containing conductive particles and a binder resin onto the surface of the base material, followed by heating as necessary.

The conductive paste may contain an additive as necessary.

The conductive paste may contain an organic solvent as necessary. As the organic solvent, a known organic solvent used for general conductive pastes (those containing conductive particles and a binder resin) can be used, and examples thereof include butyl diglycol acetate, terpineol, and isophorone.

In the conductive paste, although the content of the organic solvent is not particularly limited as long as the coating suitability when applying the conductive paste onto the base material can be ensured, it is preferable to adjust the content so that the content of nonvolatile components (components other than the organic solvent) of the conductive paste is, for example, from 70 to 90% by mass.

Examples of the base material include an insulating base material and the like. Examples of the insulating base material include resin base materials such as polyethylene terephthalate (PET), polycarbonate, polyethylene naphthalate (PEN), and thermoplastic polyurethane (TPU).

Examples of the form of the base material include a film form and a plate form.

Examples of the method for applying the conductive paste include known coating methods such as a gravure printing method, an offset printing method, a screen printing method, a roll coating method, and a bar coating method.

Examples of heating conditions include conditions of 80 to 130° C. for 3 to 30 minutes.

By forming an overcoat on the conductive coating film formed on the base material as described above, a laminate having the coating film structure of the present embodiment provided on the base material can be obtained.

If necessary, the obtained laminate may be subjected to molding processing such as bending and vacuum thermoforming.

The obtained laminate can be used for applications such as printed circuit boards and touch sensors.

EXAMPLES

The present invention will be described in more detail below based on a series of Examples and Comparative Examples, although the present invention is in no way limited by these Examples. The term "parts" indicates "parts by mass".

<Measurement/Evaluation>
(Calculation of Tg)

The Tg of a polymer block was obtained from the Fox formula shown in the above formula (i).

(Measurement of Acid Value)

The acid value was measured in accordance with JIS K 2501:2003. More specifically, it was measured by titrating a solution prepared by dissolving potassium hydroxide in methanol to achieve a concentration of 0.1N.

(Measurement of Electrical Resistance Value)

An electrical resistance value of a conductive coating film was measured with a digital multimeter ("6581" manufactured by ADC Corporation).

(Change in Electrical Resistance Value During Application of Overcoat Agent)

For the obtained evaluation sample, the electrical resistance value of the conductive coating film (the electrical resistance value of the conductive coating film after application of the overcoat agent) was measured using a digital multimeter ("6581" manufactured by ADC Corporation). From the measurement results, the rate of change in electrical resistance value was calculated by: ([electrical resistance value of conductive coating film after application of overcoat agent]−[electrical resistance value before application of overcoat agent])/[electrical resistance value before application of overcoat agent]×100(%).

(Appearance of Conductive Coating Film and Overcoat after Overcoat Drying)

A conductive coating film of the obtained evaluation sample (after drying the overcoat) was visually observed and evaluated in accordance with the following criteria. The overcoat was also evaluated in the same manner.
   A: No wrinkles are observed.
   C: Wrinkles are observed.

(Appearance of Overcoat after Thermoforming)

The obtained evaluation sample was thermoformed with an elongation percentage of 100% using a vacuum forming machine. The overcoat of the evaluation sample after the above thermoforming process was visually observed and evaluated in accordance with the following criteria.
   A: No cracks are observed in the overcoat, and the surface of the overcoat shows no tackiness.
   B: Fine cracks are observed in the overcoat, or the surface of the overcoat is slightly tacky, but it is sufficient for practical use.
   C: Cracks are observed in the overcoat, or the surface of the overcoat is clearly tacky.

(Appearance after Stretchability Test)

Using a desktop endurance testing machine, expansion and contraction of the obtained evaluation sample so that the length of the conductive coating film changed from 50 mm to 60 mm was repeated 100 times at an expansion and contraction rate of 1,200 mm/min. After that, the appearance of the overcoat was visually observed and evaluated in accordance with the following criteria.
   A: No cracks were observed in the overcoat, and the surface of the overcoat shows no tackiness.

B: Fine cracks are observed in the overcoat, or the surface of the overcoat is slightly tacky, but it is sufficient for practical use.

C: Cracks are observed in the overcoat, or the surface of the overcoat is clearly tacky.

<Preparation of Conductive Paste>

A conductive paste was obtained by mixing and dispersing each material in accordance with the composition shown in Table 1.

TABLE 1

|  | Amount added [parts] |
|---|---|
| UE-3400 | 11.4 |
| SBN-70D | 0.34 |
| Butyl diglycol acetate | 20 |
| SF70 | 60 |

The abbreviations in Table 1 indicate the following.

UE-3400: polyester resin, "Elitel UE-3400" manufactured by Unitika Ltd., hydroxyl value: 4 mgKOH/g.

SBN-70D: HDI-based blocked isocyanate, "Duranate SBN-70D" manufactured by Asahi Kasei Corporation, solid content: 70% by mass, NCO: 10.0% by mass.

SF70: silver powder, manufactured by Ames Goldsmith, average particle size: 2.6 μm.

<Production of Copolymer>

Production Example A-1

[1st Step RAFT Polymerization]

In the Examples, first, 29.7 g of methyl methacrylate (MMA), 0.3 g of acrylic acid (AA), 0.60 g of a RAFT agent (1) (a compound represented by a formula (1) described later), 0.15 g of 2,2'-azobis(2-methylbutyronitrile) (ABN-E) and 30 g of ethyl acetate were charged into a two-necked flask, the temperature was raised to 85° C. while replacing the atmosphere inside with nitrogen gas, and then a polymerization reaction was carried out with stirring for 6 hours.

After completion of the polymerization reaction, the contents in the two-necked flask were added into 1,000 g of n-hexane, and the reactant was reprecipitated by stirring, separated by filtration and then dried under reduced pressure at 70° C. to obtain a block (2), which was a copolymer with a ratio of MMA:AA=99:1 (mass ratio).

[2nd Step RAFT Polymerization]

Next, 27.0 g of the above block (2), 13.5 g of n-butyl acrylate (BA), 13.5 g of 2-ethylhexyl acrylate (2-EHA), 0.04 g of ABN-E, and 60.0 g of ethyl acetate were charged into a two-necked flask, the temperature was raised to 85° C. while replacing the atmosphere inside with nitrogen gas, and then a polymerization reaction was carried out with stirring for 6 hours.

After completion of the reaction, the contents in the two-necked flask were added into 1,000 g of n-hexane, and the reactant was reprecipitated by stirring, separated by filtration and then dried under reduced pressure at 70° C. to obtain a copolymer having a triblock structure composed of a block (1), which is a copolymer having a ratio BA:2-EHA=50:50 (mass ratio), and the above blocks (2) located respectively on both ends of the above block (1), and having a ratio represented by the formula: total mass of two blocks (2)/mass of block (1) (hereinafter also referred to as "block (2)/block (1)") of 60/40. Tables 2 and 3 show the acid value of the obtained copolymer and Tg of each of the block (1) and the block (2).

It should be noted that since the block (2) on one end of the block (1) and the block (2) on the other end are those obtained by dividing the single block (2) synthesized in the previous step at the center, these blocks (2) can be regarded as the same block.

Production Examples A-2 to A-12

Copolymers A-2 to A-12 were obtained in the same manner as in Production Example 1 with the exception that the types and compositions (% by mass) of monomers forming the block (1) or block (2) and the ratios of block (2)/block (1) were changed to those shown in Tables 2 and 3. Blanks in Tables 2 and 3 indicate that the component was not included. Tables 2 and 3 show the acid value of the obtained copolymer and Tg of each of the blocks (1) and (2).

TABLE 2

| | | | A-1 | A-2 | A-3 | A-4 | A-5 | A-6 |
|---|---|---|---|---|---|---|---|---|
| 1st step: Block (2) | Monomer composition [g] | MMA | 29.7 | 29.7 | 29.7 | 29.7 | 21 | |
| | | St | | | | | | 29.7 |
| | | CHMA | | | | | | |
| | | n-BMA | | | | | 8.7 | |
| | | AA | 0.3 | 0.3 | 0.3 | 0.3 | 0.3 | 0.3 |
| | RAFT agent (1) [g] | | 0.6 | 0.6 | 0.6 | 0.6 | 0.6 | 0.6 |
| | ABN-E [g] | | 0.15 | 0.15 | 0.15 | 0.15 | 0.15 | 0.15 |
| | Ethyl acetate [g] | | 30 | 30 | 30 | 30 | 30 | 30 |
| 2nd step: Block (1) | First polymer | | 40.5 | 3 | 27 | 11.6 | 18 | 18 |
| | Monomer composition [g] | EA | | | | | 18.9 | 13.5 |
| | | BA | 13.5 | 13.5 | 13.5 | 8.1 | 13.5 | 13.5 |
| | | 2-EHA | 13.5 | 13.5 | 13.5 | | | 13.5 |
| | ABN-E [g] | | 0.04 | 0.04 | 0.04 | 0.04 | 0.04 | 0.04 |
| | Ethyl acetate [g] | | 60 | 60 | 60 | 60 | 60 | 60 |
| Block (1) | Monomer composition [wt %] | EA | | | | | 70 | 50 |
| | | BA | 50 | 50 | 50 | 30 | 50 | 50 |
| | | 2-EHA | 50 | 50 | 50 | | | 50 |
| | Tg [° C.] | | −62 | −62 | −62 | −32 | −39 | −62 |
| Block (2) | Monomer composition [wt %] | MMA | 99 | 99 | 99 | 99 | 70 | |
| | | St | | | | | | 99 |
| | | CHMA | | | | | | |
| | | n-BMA | | | | | 29 | |
| | | AA | 1 | 1 | 1 | 1 | 1 | 1 |
| | Tg [° C.] | | 105 | 105 | 105 | 105 | 76 | 100 |
| | Block (2)/Block (1) | | 60/40 | 10/90 | 50/50 | 30/70 | 40/60 | 40/60 |

TABLE 3

|  |  |  | A-7 | A-8 | A-9 | A-10 | A-11 | A-12 |
|---|---|---|---|---|---|---|---|---|
| 1st step: Block (2) | Monomer composition [g] | MMA |  | 11.7 | 30 |  | 17.7 |  |
|  |  | St | 29.7 |  |  | 29.7 |  | 29.7 |
|  |  | CHMA |  | 18 |  |  |  |  |
|  |  | n-BMA |  |  |  |  | 12 |  |
|  |  | AA | 0.3 | 0.3 |  | 0.3 | 0.3 | 0.3 |
|  | RAFT agent (1) [g] |  | 0.6 | 0.6 | 0.6 | 0.6 | 0.6 | 0.6 |
|  | ABN-E [g] |  | 0.15 | 0.15 | 0.15 | 0.15 | 0.15 | 0.15 |
|  | Ethyl acetate [g] |  | 30 | 30 | 30 | 30 | 30 | 30 |
| 2nd step: Block (1) | First polymer |  | 6.8 | 27 | 40.5 | 1.4 | 18 | 18 |
|  | Monomer composition [g] | EA |  |  |  |  |  | 27 |
|  |  | BA | 13.5 | 13.5 |  | 13.5 | 13.5 |  |
|  |  | 2-EHA | 13.5 | 13.5 | 27 | 13.5 | 13.5 |  |
|  | ABN-E [g] |  | 0.04 | 0.04 | 0.04 | 0.04 | 0.04 | 0.04 |
|  | Ethyl acetate [g] |  | 60 | 60 | 60 | 60 | 60 | 60 |
| Block (1) | Monomer composition [wt %] | EA |  |  |  |  |  | 100 |
|  |  | BA | 50 | 50 |  | 50 | 50 |  |
|  |  | 2-EHA | 50 | 50 | 100 | 50 | 50 |  |
|  | Tg [° C.] |  | −62 | −62 | −70 | −62 | −62 | −22 |
| Block (2) | Monomer composition [wt %] | MMA |  | 39 | 100 |  | 59 |  |
|  |  | St | 99 |  |  | 99 |  | 99 |
|  |  | CHMA |  | 60 |  |  |  |  |
|  |  | n-BMA |  |  |  |  | 40 |  |
|  |  | AA | 1 | 1 |  | 1 | 1 | 1 |
|  | Tg [° C.] |  | 100 | 81 | 100 | 100 | 66 | 100 |
|  | Block (2)/Block (1) |  | 20/80 | 50/50 | 60/40 | 5/95 | 40/60 | 40/60 |

Abbreviations in Tables 2 and 3 indicate the following. Further, the Tg in parentheses after each monomer is the Tg of the homopolymer.
MMA: methyl methacrylate (Tg: 105° C.).
St: styrene (Tg: 100° C.).
CHMA: cyclohexyl methacrylate (Tg: 66° C.).
n-BMA: n-butyl methacrylate (Tg: 20° C.).
AA: acrylic acid (Tg: 106° C.).
EA: ethyl acrylate (Tg: −22° C.).
2-EHA: 2-ethylhexyl acrylate (Tg: −70° C.).
BA: n-butyl acrylate (Tg: −54° C.).
ABN-E: 2,2'-azobis(2-methylbutyronitrile).
RAFT agent (1): a compound represented by the following formula (1).

Examples 1 to 15, Comparative Examples 1 to 2

The obtained conductive paste was applied on a polycarbonate plate by screen printing so as to achieve a linear pattern of 1.0 mm (width)×50 mm (length), and heated at 120° C. for 30 minutes to form a conductive coating film, and the electric resistance value (electric resistance value before application of the overcoat agent) was measured.

According to the compositions shown in Tables 4 and 5, each material was mixed to obtain an overcoat agent. Blanks in Tables 4 and 5 indicate that the component was not included.

[Chemical Formula 1]

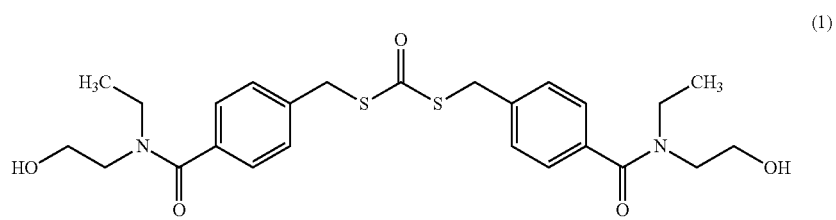

(1)

The obtained overcoat agent was applied onto the conductive coating film of the polycarbonate plate described above by screen printing and heated at 120° C. for 30 minutes to form an overcoat with a thickness of 20.0 μm. As a result, an evaluation sample in which a conductive coating film and an overcoat were laminated on a polycarbonate plate was obtained.

The obtained evaluation samples were evaluated as described above. The results are shown in Tables 4 and 5.

TABLE 4

| | | | Nonvolatile component | Example | | | | | | | | |
|---|---|---|---|---|---|---|---|---|---|---|---|---|
| | | | (wt %) | 1 | 2 | 3 | 4 | 5 | 6 | 7 | 8 | 9 |
| Composition [parts] | Resin component | A-1 | 100 | 30 | | | | | | | | |
| | | A-2 | 100 | | 30 | | | | | | | |
| | | A-3 | 100 | | | 30 | 30 | 15 | | | | |
| | | A-4 | 100 | | | | | | 30 | | | |
| | | A-5 | 100 | | | | | | | 30 | | |
| | | A-6 | 100 | | | | | 15 | | | 30 | 30 |
| | | A-7 | 100 | | | | | | | | | |
| | | A-8 | 100 | | | | | | | | | |
| | | A-9 | 100 | | | | | | | | | |
| | | A-10 | 100 | | | | | | | | | |
| | | A-11 | 100 | | | | | | | | | |
| | | A-12 | 100 | | | | | | | | | |
| | | jER1256 | 100 | | | | | | | | | |
| | | UE3510 | 100 | | | | | | | | | |
| | Crosslinking agent | SBN-70D | 70 | 2.1 | 2.1 | 2.1 | | 2.1 | 2.1 | 2.1 | 2.1 | 1.1 |
| | Solvent | Solfit | 0 | 70 | 70 | 70 | 70 | 70 | 70 | 70 | 70 | 70 |
| | | Isophorone | 0 | | | | | | | | | |
| Rate of change in electrical resistance value of conductive coating film during application of overcoat agent [%] | | | | 105 | 108 | 99 | 101 | 97 | 100 | 104 | 104 | 99 |
| Conductive coating film appearance after overcoat drying | | | | A | A | A | A | A | A | A | A | A |
| Overcoat appearance after overcoat drying | | | | A | A | A | A | A | A | A | A | A |
| Overcoat appearance after thermoforming | | | | B Cracks | A | A | A | A | B Cracks | B Tackiness | A | A |
| Appearance after stretchability test | | | | B Cracks | A | A | A | A | B Cracks | A | A | A |

TABLE 5

| | | | Nonvolatile component | Example | | | | | | Comparative Example | |
|---|---|---|---|---|---|---|---|---|---|---|---|
| | | | (wt %) | 10 | 11 | 12 | 13 | 14 | 15 | 1 | 2 |
| Composition [parts] | Resin component | A-1 | 100 | | | | | | | | |
| | | A-2 | 100 | | | | | | | | |
| | | A-3 | 100 | | | | | | | | |
| | | A-4 | 100 | | | | | | | | |
| | | A-5 | 100 | | | | | | | | |
| | | A-6 | 100 | | | | | | | | |
| | | A-7 | 100 | 30 | | | | | | | |
| | | A-8 | 100 | | 30 | | | | | | |
| | | A-9 | 100 | | | 30 | | | | | |
| | | A-10 | 100 | | | | 30 | | | | |
| | | A-11 | 100 | | | | | 30 | | | |
| | | A-12 | 100 | | | | | | 30 | | |
| | | jER1256 | 100 | | | | | | | 30 | |
| | | UE3510 | 100 | | | | | | | | 30 |
| | Crosslinking agent | SBN-70D | 70 | 2.1 | 2.1 | 2.1 | 2.1 | 2.1 | 2.1 | 2.1 | 2.1 |
| | Solvent | Solfit | 0 | 70 | 70 | 70 | 70 | 70 | 70 | 70 | |
| | | Isophorone | 0 | | | | | | | | 70 |
| Rate of change in electrical resistance value of conductive coating film during application of overcoat agent [%] | | | | 102 | 105 | 99 | 107 | 108 | 102 | 154 | 172 |
| Conductive coating film appearance after overcoat drying | | | | A | A | A | A | A | A | C | C |
| Overcoat appearance after overcoat drying | | | | A | A | A | A | A | A | A | A |
| Overcoat appearance after thermoforming | | | | A | A | B Tackiness | C Cracks | C Tackiness | C Cracks | A | A |
| Appearance after stretchability test | | | | A | A | B Tackiness | C Cracks | C Tackiness | C Cracks | C Cracks | C Cracks |

Abbreviations in Tables 4 and 5 indicate the following.
jER1256: phenoxy-type epoxy resin, manufactured by Mitsubishi Chemical Corporation.
UE3510: polyester resin, "Elitel UE-3510" manufactured by Unitika Ltd.
SBN-70D: HDI-based blocked isocyanate, "Duranate SBN-70D" manufactured by Asahi Kasei Corporation, solid content: 70% by mass, NCO: 10.0% by mass.
Solfit: 3-methoxy-3-methyl-1-butanol, manufactured by Kuraray Co., Ltd.

As shown in the above results, in each of Examples 1 to 15, compared to Comparative Examples 1 and 2, the increase in the resistance value of the conductive coating film at the time of coating the overcoat agent was suppressed. In addition, the appearance of the conductive coating film after thermoforming was favorable. In particular, the appearance of overcoat after thermoforming was also excellent in Examples 1 to 12 in which the Tg of block (1) was from −75 to −35° C., the Tg of the block (2) was 75° C. or higher, and the ratio represented by a formula: (mass of block (2))/(mass of block (1)) was within a range of 10/90 to 60/40.

INDUSTRIAL APPLICABILITY

According to the present invention, it is possible to provide an overcoat agent for a conductive coating film, an insulating overcoat for a conductive coating film, and a coating film structure with which the resistance value of the conductive coating film is less likely to increase.

REFERENCE SIGNS LIST

10: Coating film structure
11: Conductive coating film
13: Overcoat (insulating overcoat for conductive coating film)
20: Base material

The invention claimed is:

1. An overcoat agent to form an insulating overcoat, the overcoat agent comprising a (meth)acrylic copolymer having a triblock structure composed of a first polymer block and two second polymer blocks that are different from the first polymer block and are respectively located on both end sides of the first polymer block, wherein the each second polymer block includes a functional group-containing monomer unit selected from the group consisting of a carboxy group-containing monomer unit, a hydroxy group-containing monomer unit, and a glycidyl group-containing monomer unit, and wherein each of the two second polymer blocks has a glass transition temperature of 75° C. or higher.

2. The overcoat agent according to claim 1, wherein a ratio represented by a formula: (total mass of the two second polymer blocks)/(mass of the first polymer block) is within a range of 10/90 to 60/40.

3. The overcoat agent for according to claim 2, wherein the first polymer block has a glass transition temperature of −75 to −35° C.

4. An insulating overcoat formed from the overcoat agent of claim 2.

5. A coating film structure comprising a conductive coating film and the insulating overcoat of claim 4.

6. The overcoat agent for according to claim 1, wherein the first polymer block has a glass transition temperature of −75 to −35° C.

7. An insulating overcoat formed from the overcoat agent of claim 6.

8. A coating film structure comprising a conductive coating film and the insulating overcoat of claim 7.

9. An insulating overcoat formed from the overcoat agent of claim 1.

10. A coating film structure comprising a conductive coating film and the insulating overcoat of claim 9.

11. The overcoat agent according to claim 1, wherein the each second polymer block further includes a cyclic structure-containing monomer unit, and the cyclic structure-containing unit is derived from an aromatic vinyl compound.

12. An insulating overcoat formed from an overcoat agent comprising a (meth)acrylic copolymer having a triblock structure composed of a first polymer block and two second polymer blocks that are different from the first polymer block and are respectively located on both end sides of the first polymer block, wherein the each second polymer block includes a functional group-containing monomer unit selected from the group consisting of a carboxy group-containing monomer unit, a hydroxy group-containing monomer unit, and a glycidyl group-containing monomer unit, and wherein each of the two second polymer blocks has a glass transition temperature of 75° C. or higher.

13. A coating film structure comprising a conductive coating film and an insulating overcoat formed from an overcoat agent comprising a (meth)acrylic copolymer having a triblock structure composed of a first polymer block and two second polymer blocks that are different from the first polymer block and are respectively located on both end sides of the first polymer block, wherein the each second polymer block includes a functional group-containing monomer unit selected from the group consisting of a carboxy group-containing monomer unit, a hydroxy group-containing monomer unit, and a glycidyl group-containing monomer unit, and wherein each of the two second polymer blocks has a glass transition temperature of 75° C. or higher.

* * * * *